(12) United States Patent
Sabba et al.

(10) Patent No.: US 8,828,145 B2
(45) Date of Patent: Sep. 9, 2014

(54) METHOD OF PARTICLE CONTAMINANT REMOVAL

(75) Inventors: Yizhak Sabba, Castro Valley, CA (US); Seokmin Yun, Pleasanton, CA (US); Mark Kawaguchi, Sunnyvale, CA (US); Mark Wilcoxson, Oakland, CA (US); Dragan Podlesnik, Palo Alto, CA (US)

(73) Assignee: Lam Research Corporation, Fremont, CA (US)

(*) Notice: Subject to any disclaimer, the term of this patent is extended or adjusted under 35 U.S.C. 154(b) by 416 days.

(21) Appl. No.: 12/401,590

(22) Filed: Mar. 10, 2009

(65) Prior Publication Data
US 2010/0229890 A1 Sep. 16, 2010

(51) Int. Cl.
- B08B 7/00 (2006.01)
- B08B 6/00 (2006.01)
- B08B 5/04 (2006.01)
- H01L 21/67 (2006.01)
- H01L 21/02 (2006.01)

(52) U.S. Cl.
CPC .... H01L 21/02057 (2013.01); H01L 21/67051 (2013.01)
USPC .................................. 134/4; 134/1.3; 134/21

(58) Field of Classification Search
CPC .......... B08B 3/00; B08B 7/00; B08B 7/0028; H01L 21/0204; H01L 21/02201
USPC ....................... 134/4, 1, 1.3, 42, 21
See application file for complete search history.

(56) References Cited

U.S. PATENT DOCUMENTS

| | | | | |
|---|---|---|---|---|
| 5,813,087 A | * | 9/1998 | Huffman | 15/321 |
| 5,839,460 A | * | 11/1998 | Chai et al. | 134/147 |
| 5,893,756 A | | 4/1999 | Berman et al. | |
| 6,297,159 B1 | * | 10/2001 | Paton | 438/693 |
| 6,325,612 B1 | * | 12/2001 | Nakamura et al. | 425/174 |
| 6,776,171 B2 | * | 8/2004 | Carpenter et al. | 134/1.3 |
| 7,981,221 B2 | * | 7/2011 | Sinha | 134/1.3 |
| 2007/0087950 A1 | * | 4/2007 | Korolik et al. | 510/175 |

FOREIGN PATENT DOCUMENTS

| | | |
|---|---|---|
| EP | 1803504 A2 | 7/2007 |
| JP | 2003-068696 A | 3/2003 |

OTHER PUBLICATIONS

Said et al., Application of time-stress equivalence to nonlinear creep of polycarbonate, Polymer Testing 24(2005) 463-467.*
C.A. Daniels, Ph.D., PE, Polymers Structure and Properties, Technomic Publishing Company, Inc., Pennsylavania, 1989. http://books.google.com/books?id=SwsNbiMDqzcC&pg=PA57&dq=long+relaxation+time++polymer&hl=en&sa=X&ei=Qq0FT4K1GITo0QHoqoD3BQ&ved=0CDAQ6AEwAA#v=onepage&q=long%20relaxation%20time%20%20polymer&f=false.*
International Preliminary Report on Patentability—PCT/IB/373 (Jan. 2004) 5 pages.

* cited by examiner

*Primary Examiner* — Eric Golightly
*Assistant Examiner* — Arlyn I Rivera-Cordero
(74) *Attorney, Agent, or Firm* — Martine Penilla Group, LLP

(57) ABSTRACT

Apparatus and methods for removing particle contaminants from a surface of a substrate includes coating a layer of a viscoelastic material on the surface. The viscoelastic material is coated as a thin film and exhibits substantial liquid-like characteristic. An external force is applied to a first area of the surface coated with the viscoelastic material such that a second area of the surface coated with the viscoelastic material is not substantially subjected to the applied force. The force is applied for a time duration that is shorter than a intrinsic time of the viscoelastic material so as to access solid-like characteristic of the viscoelastic material. The viscoelastic material exhibiting solid-like characteristic interacts at least partially with at least some of the particle contaminants present on the surface. The viscoelastic material along with at least some of the particle contaminants is removed from the first area of the surface while the viscoelastic material is exhibiting solid-like characteristics.

10 Claims, 8 Drawing Sheets

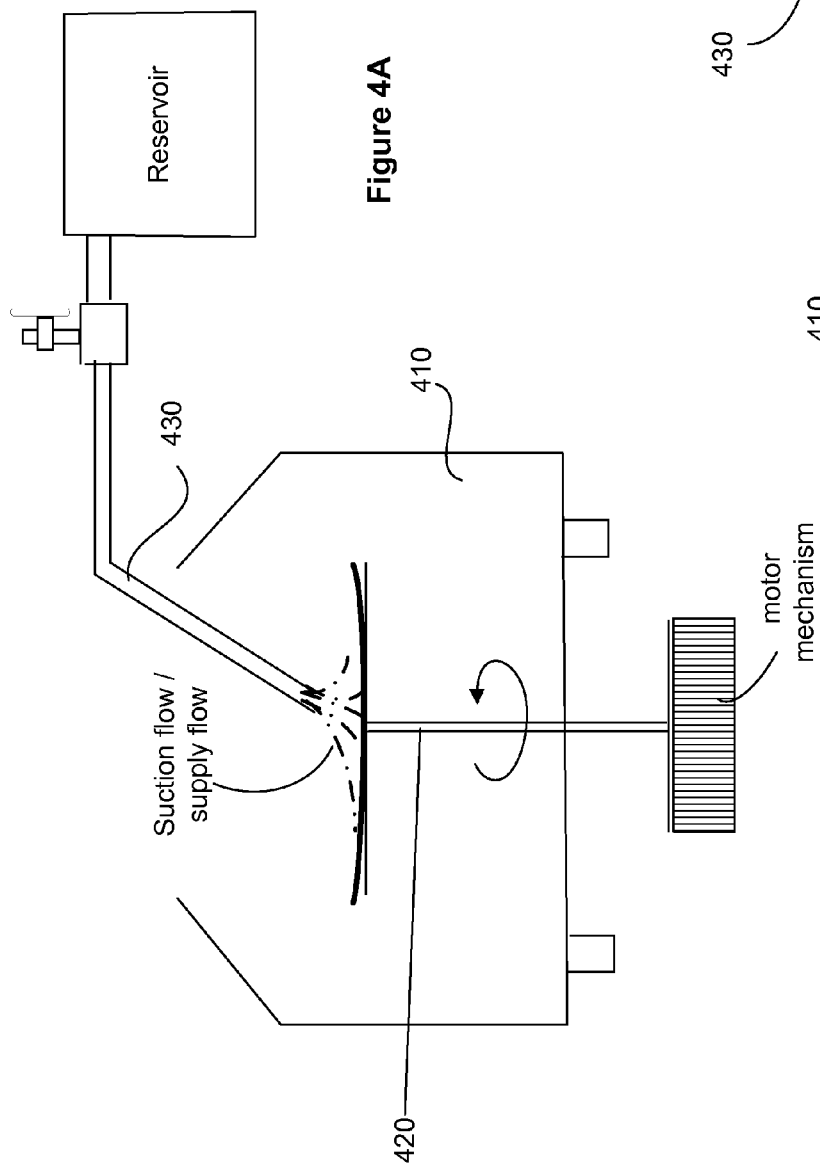
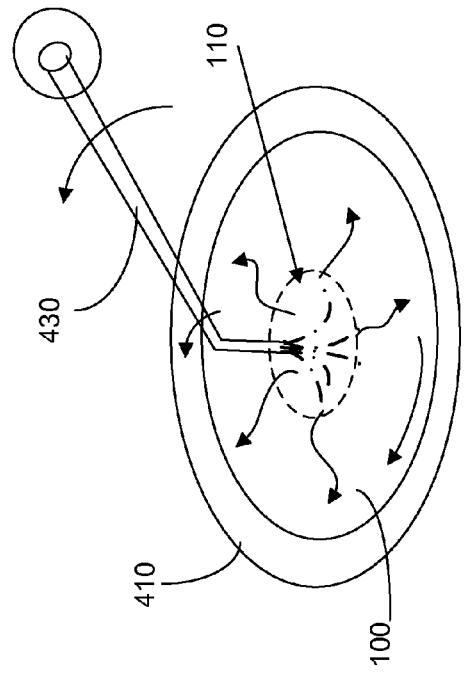
Figure 4A
Figure 4B

METHOD OF PARTICLE CONTAMINANT REMOVAL

CROSS REFERENCE TO RELATED APPLICATION

This application is related to U.S. patent application Ser. No. 12/131,654 filed on Jun. 2, 2008, and entitled "MATERIALS FOR PARTICLE REMOVAL BY SINGLE-PHASE AND TWO-PHASE MEDIA," and to U.S. patent application Ser. No. 12/165,577, filed on Jun. 30, 2008, entitled "SINGLE SUBSTRATE PROCESSING HEAD FOR PARTICLE REMOVAL USING LOW VISCOSITY FLUID." This application is also related to U.S. patent application Ser. No. 12/262,094 filed on Oct. 30, 2008, and entitled "ACOUSTIC ASSISTED SINGLE WAFER WET CLEAN FOR SEMICONDUCTOR WAFER PROCESS." The aforementioned patent applications are incorporated herein by reference.

BACKGROUND OF THE INVENTION

1. Field of the Invention

The present invention relates generally to cleaning of solid surfaces, such as semiconductor substrate, and, more particularly, to methods and apparatus for utilizing an external force to access solid-like characteristic of a liquid cleaning medium to clean a semiconductor substrate following fabrication processes.

2. Description of the Related Art

It is well-known in the art that there is a need to clean and dry a solid surface that has undergone a fabrication operation which leaves unwanted defects or contaminant particles on the solid surface. Examples of such fabrication operations include plasma etching (e.g., via etch or trench etch for copper dual damascene applications) and chemical mechanical polishing (CMP). Various cleaning processes have been used in removing the unwanted defects from the surface of the substrate after each fabrication operation. Some of the cleaning processes involve selecting a liquid medium with chemical structure that enables at least partial bonding or interaction with the particle contaminants and promptly removing the liquid medium along with the particle contaminants.

Still other processes involve selection of a liquid medium, substantially applying the liquid medium to cover at least a portion of the substrate, propagating acoustic energy through the liquid medium and using the acoustic energy to remove particles from the surface of the substrate. The propagation of acoustic energy through the liquid medium enables cleaning chiefly through cavitation, microstreaming, and chemical reaction enhancement when chemicals are used as the liquid medium. Cavitation is the rapid forming and collapsing of microscopic bubbles from dissolved gases in the liquid medium under the action of sonic agitation. Upon collapse, the bubbles release energy. The energy from the collapsed bubbles assists in particle removal through breakage of the various adhesion forces that allow the particles to adhere to the substrate. Acoustic microstreaming is the fluid motion induced by the velocity gradient from propagation of an acoustic wave through the liquid medium under a high frequency vibration. The acoustic energy provides the activation energy to facilitate the chemical reactions within the liquid medium.

As the critical dimensions of features formed on the surface of the substrate continue to decrease, the number of sub-micron particles with dimensions that are comparable to the critical dimensions of the features increases. Due to the critical dimensions of the sub-micron particles, there is always a need for improved cleaning techniques that substantially clean the surface of the substrate without damaging the features formed on the substrate so that the yield of devices resulting from the fabrication is not compromised.

It is in this context that embodiments of the invention arise.

SUMMARY OF THE INVENTION

Broadly speaking, the present invention fills these needs by providing a cleaning mechanism that is capable of providing external force, in a controlled and effective manner, so as to access solid-like characteristics of a liquid medium applied to a surface of a substrate, such as a semiconductor substrate. It should be appreciated that the present invention can be implemented in numerous ways, including as a process, an apparatus, or a system. Several inventive embodiments of the present invention are described below.

In one embodiment, a method for cleaning particle from a surface of a substrate, such as a semiconductor substrate, is provided. The method includes coating a viscoelastic material as a liquid to the surface as a thin film. An external force is applied at a first area of the surface coated with the viscoelastic material such that a second area of the surface coated with viscoelastic material is not substantially subjected to the applied force. The external force is applied for a time duration that is shorter than an intrinsic time of the viscoelastic material. The short application of external force is sufficient to enable the viscoelastic material to exhibit solid-like characteristics. The viscoelastic material is then removed from a region of the first area of the surface along with at least some of the particles while the viscoelastic material is continuing to exhibit solid-like characteristics during the application of the force resulting in a fairly clean surface. The viscoelastic material continues to exhibit the liquid-like characteristic in the second area while the viscoelastic material is being removed from the region of the first area.

In another embodiment, a particle removal mechanism for cleaning a surface of a substrate is provided. The particle removal mechanism includes a carrier mechanism to hold the substrate to be cleaned, dispense head, a force applicator head and a rinse head. The carrier mechanism is configured to receive, hold and transport the substrate along an axis. The dispense head is configured to coat a viscoelastic material as a thin liquid film to the surface of the substrate. The force applicator head is configured to supply a force to a first area of the surface coated with the meniscus of the viscoelastic material. The force is applied to the viscoelastic material for a time duration that is shorter than an intrinsic time of the viscoelastic material so as to enable access to the solid-like characteristics of the viscoelastic material for easy removal. The rinse head is configured to provide a liquid chemical as a rinse meniscus and to remove the liquid chemical and viscoelastic material along with at least some of the particles from the first area of the surface while the force is being applied. The viscoelastic material continues to exhibit liquid-like characteristic in the second area during the removal of the viscoelastic material in a region of the first area.

In another embodiment, a particle removal mechanism for removing particles from a surface of a substrate is provided. The particle removal mechanism includes a receptacle to hold a viscoelastic material as a liquid medium, a carrier mechanism to receive, support and hold the substrate within the receptacle so as to provide a thin layer of the viscoelastic material on the surface. A force applicator mechanism is included to provide a force to a first area of the surface coated with the viscoelastic material such that a second area of the substrate coated with viscoelastic material is not substantially subjected to the applied force. The force is applied for a time duration that is shorter than an intrinsic time of the viscoelastic material so as to enable access to solid-like characteristics of the viscoelastic material. The force applicator mechanism may also be configured to remove the viscoelastic material along with at least some of the particle contaminants from a region of the first area on the surface coated with the viscoelastic material while the force is being applied and while the viscoelastic material continues to exhibit solid-like characteristics. The viscoelastic material continues to exhibit liquid-like characteristic in the second area during the removal of the viscoelastic material from the region of the first area. The resulting surface is substantially clean while preserving the features formed on the substrate.

By accessing the solid-like characteristics of the viscoelastic material, the viscoelastic material is removed as a single piece at the viscoelastic film-substrate interface leaving behind a substantially clean surface. The process allows thorough removal of the viscoelastic material along with the particles, now embedded within the viscoelastic material, thereby minimizing the amount of residual contamination left behind. The embodiments of the invention rely on the liquid-like characteristics of the viscoelastic material when applied to the surface of the substrate as well as the final rinsing step, and relies on the solid-like characteristics of the viscoelastic material when removing particles and the viscoelastic material from the surface. The liquid-like characteristic enables wetting of the surface topography while the solid-like characteristic enables for at least partial binding or interaction with particles to be removed and for easy and thorough removal from the surface. This method is effective and efficient for cleaning the surface of the substrate.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 4A illustrates a side view of an alternate embodiment using an oscillatory motion for removing particle contaminants, in one embodiment of the invention.

FIG. 4B illustrates a top view of the embodiment illustrated in FIG. 4A.

DETAILED DESCRIPTION OF THE PREFERRED EMBODIMENTS

Figure 1A:
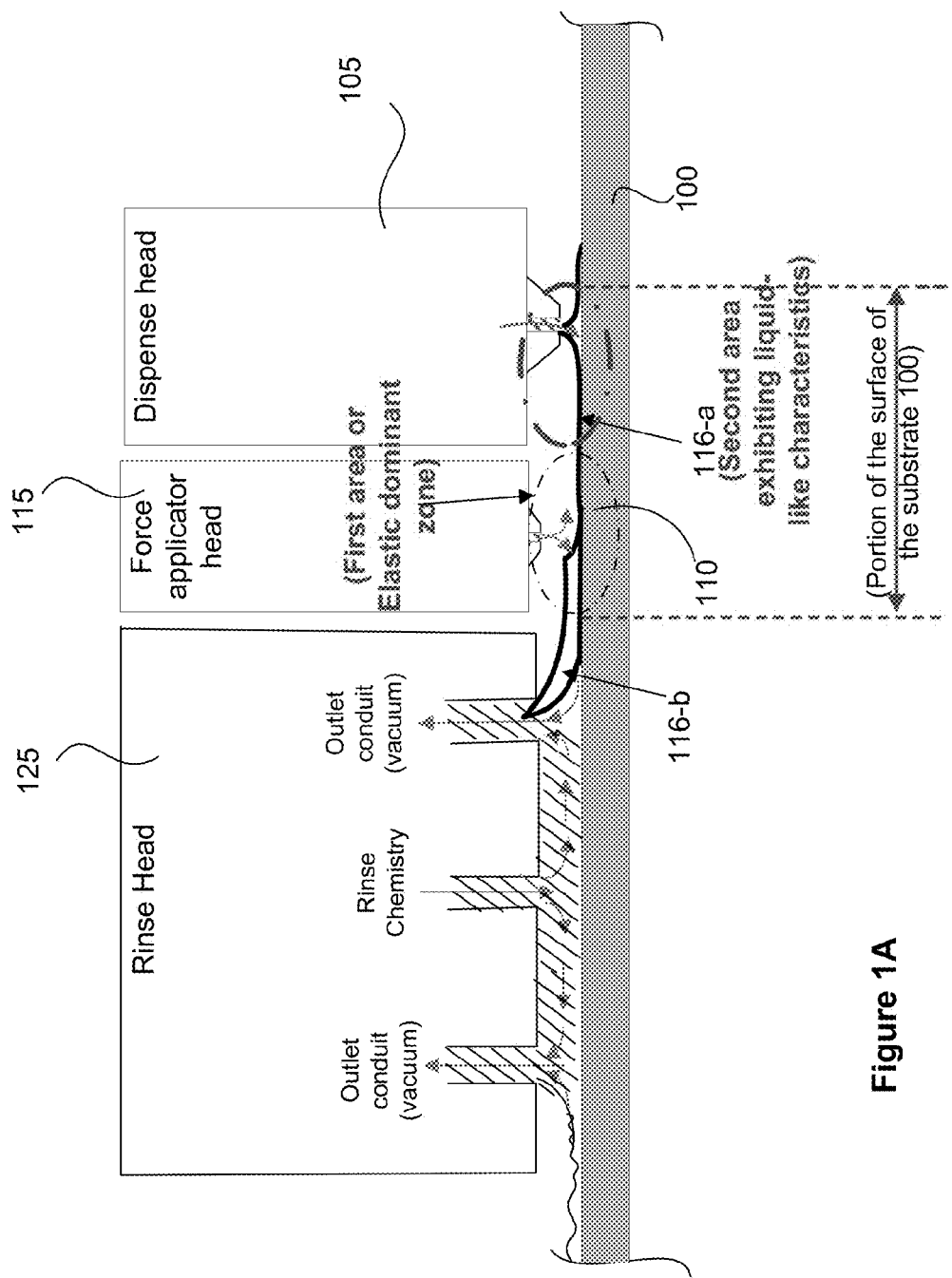
FIG. 1A illustrates a side view of a simplified block diagram of a particle removal mechanism using a push force, in one embodiment of the invention.

Several embodiments for effectively removing particle contaminants from a surface of a substrate are now described. It will be obvious, however, to one skilled in the art, that the present invention may be practiced without some or all of these specific details. In other instances, well known process operations have not been described in detail in order not to unnecessarily obscure the present invention.

Embodiments of the invention provide a particle removal mechanism for cleaning a surface of a substrate using a viscoelastic material and providing an external force to access the solid-like characteristic of the viscoelastic material. The viscoelastic material is selected such that the chemical structure of the material allows for at least partial binding or interaction with particle contaminants that are to be removed from the surface. The viscoelastic material is coated on to the surface as a thin film of liquid and the external force is applied to a first area of the surface coated with the viscoelastic material such that a second area of the surface coated with viscoelastic material is not substantially subjected to the applied force. The force is applied for a time duration that is shorter than an intrinsic time of the viscoelastic material so as to access solid-like characteristics of the viscoelastic material in a region of the first area. The viscoelastic material is removed from a region of the first area of the surface along with at least some of the particles while the external force is being applied and the material is still exhibiting solid-like characteristic. The viscoelastic material continues to exhibit liquid-like characteristics in the second area during the removal of the viscoelastic material from the region of the first area. The resulting substrate is substantially clean. The solid-like characteristic of the viscoelastic material enables easy and thorough removal of the material.

The embodiments of the invention provide an effective and efficient mechanism to remove particles from surfaces. Some of the substrates that may benefit from these embodiments include silicon substrates for semiconductor, flat panel display, solar, or imaging sensor application surface, by accessing the solid characteristics of a viscoelastic material. Accessing the elastic or solid nature of the viscoelastic material enables easy removal of the material without damaging the features, thereby enhancing the yield of electronic devices (semiconductor devices) formed on the surface, such as a semiconductor substrate. The embodiments of the invention rely on the liquid-like characteristics of the viscoelastic material when applied to the surface of the substrate as well as the final rinsing step, and relies on the solid-like characteristics of the viscoelastic material when removing particles and the viscoelastic material from the surface. It is well known in the art that most of the contaminants on the substrate are left behind by chemicals used in fabrication and cleaning processes. As a result, by accessing the solid-like characteristic, the embodiments ensure thorough removal of the viscoelastic material thereby significantly reducing the amount of contaminants, such as viscoelastic material, left behind by the cleaning process. Thus, the embodiments provide an effective and efficient cleaning process.

It should be noted that the external force may be applied during the viscoelastic material dispense process, between the viscoelastic material dispense process and rinse process, during the rinse process, or a combination of the former. The particle removal concept of the present embodiments access the elastic or solid-like nature of the viscoelastic material, which occurs when the application time of the force is less than an intrinsic time of the material. In this elastic dominant zone, the force transmitted from the viscoelastic material to the particle contaminant on the surface is sufficient and efficient for overcoming particle-to-surface adhesion and for successfully detaching the particles from the surface. This results in utilizing less force to efficiently overcome particle-to-surface adhesion and to successfully detach the particles from the surface. Once the particle-to-surface adhesion has been overcome, a rinsing process removes the material along with at least some of the particles from the surface. As can be seen, the particle removal can occur anytime after dispense of the viscoelastic material but before complete rinsing process. As a result, the force is applied prior to the rinsing process in some embodiments while in some other embodiments the force is applied during the rinsing process.

The viscoelastic material is selected such that the chemical structure associated with the viscoelastic material enables at least partial binding or interacting with the particle. In some embodiments, the viscoelastic material may be a long-chain polymer. When a force is applied to the viscoelastic material, the viscoelastic material starts exhibiting solid-like characteristics at the location where the force is applied. The solid-like characteristics enable the material to be easily peeled away from the substrate surface. The viscoelastic material is not restricted to long-chain polymers but may include suspensions, worm-like micelles, surfactants, magneto/electro-rheological solutions, and other viscoelastic solids such as rubbers, gels, and adhesives as well as combinations of the former.

With the above general understanding of the application of external force to access solid-like characteristic of a liquid medium, such as a viscoelastic material, different embodiments of the invention will now be described in detail with reference to the various drawings.

FIG. 1A illustrates a side view of a simple block diagram of a particle removal mechanism. The particle removal mechanism includes a carrier mechanism (not shown), a dispense head 105, a force applicator head 115 and a rinse head 125. The carrier mechanism is configured to receive, hold and transport a substrate 100, such as a semiconductor substrate, along an axis. The carrier mechanism may be any conventional carrier mechanism that is well known in the art or can include any other novel mechanism that provides the functionality of a conventional carrier mechanism. The dispense head 105 is configured to coat a cleaning chemical, such as a viscoelastic material, as a thin film meniscus to the surface of the substrate 100. The viscoelastic material is selected such that it has a chemical structure that at least partially binds or interacts with a plurality of particle contaminants on the surface of the substrate 100. The viscoelastic material exhibits substantial liquid-like characteristics when applied to the surface of the substrate 100.

The force applicator head 115 is configured to apply an external force to a first area of the surface coated with viscoelastic material. The application of the external force is such that a second area of the surface coated with viscoelastic material is not substantially subjected to the applied force. In one embodiment, the first area of the surface coated with viscoelastic material is away from a dispense inlet and the second area is proximal to the dispense inlet of the dispense head. An elastic dominant zone 110 is created in the first area where the force is applied. The viscoelastic material exhibits liquid-like characteristic 116-$a$ up till the elastic dominant zone 110. While exhibiting liquid-like characteristic, the material is easily applied on the surface and subsequently rinsed from the surface. In the elastic dominant zone 110, the energy from the force induces pulsing within the viscoelastic material. At this point, the viscoelastic material starts exhibiting solid-like characteristics 116-$b$ so it is easy to tug on the material and peel-off from the surface. The viscoelastic material, exhibiting solid-like characteristic, interacts at least partially with at least some of the particle contaminants on the surface and at least partially binds with the particle contaminants. The bound particle contaminants are removed from a region of the first area along with the viscoelastic material while the force is being applied and the viscoelastic material continues to exhibit solid-like characteristic. The viscoelastic material continues to exhibit the liquid-like characteristic in the second area during the removal of the viscoelastic material from the region of the first area. Thus, the embodiments work on different modes of operation (solid and liquid) successfully exploiting each mode of operation resulting in a substantially clean substrate 100.

In the embodiment illustrated in FIG. 1A, the external force is a push force, a force that impinges normally or at an angle to the wafer surface, provided at the elastic dominant zone 110 by the force applicator head 115. The push force provides sufficient energy to the viscoelastic material so as to access the solid-like characteristic. While the viscoelastic material is exhibiting the solid-like characteristic, the viscoelastic material is removed from a region of the first area using the same push force by blowing the material away from the surface. The viscoelastic material carries away at least some of the particle contaminants that have successfully interacted with the viscoelastic material during the cleaning process.

Additional rinsing is performed by the rinse head 125 so that the resulting solid surface 100 is sufficiently clean. Towards this end, the rinse head 125 is configured to supply a liquid or liquid chemical as a rinse meniscus to rinse the substrate surface after the cleaning process and to remove the rinse meniscus after successful rinsing.

Although the aforementioned embodiment is described to the use of a force applicator head, the force applicator head is optional. In one embodiment, the particle removal mechanism may include a dispense head to apply a film of viscoelastic material to the surface of the substrate followed by a rinse head to rinse the surface of the substrate. In this embodiment, the rinse head provides the external force required to enable the viscoelastic material to exhibit solid-like characteristic to enable easy removal of the viscoelastic material along with any particle contaminants from the surface of the substrate.

Figure 1B:
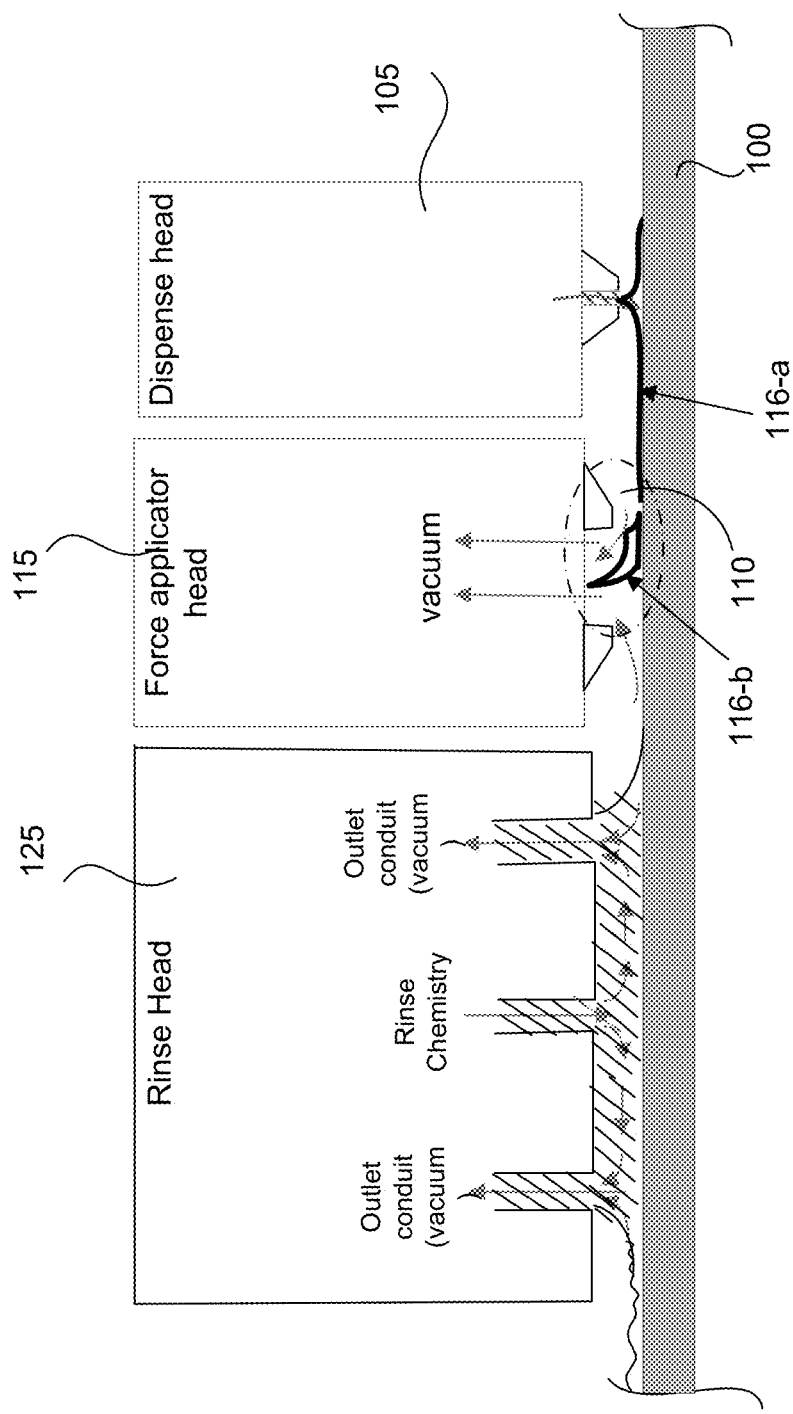
FIG. 1B illustrates a side view of the simplified block diagram of the particle removal mechanism using a pull force, in an alternate embodiment of the invention.

In another embodiment, the external force is a pull force, a force directed away from the wafer either normal or at an angle to the wafer surface. FIG. 1B illustrates a particle removal mechanism depicting the workings of a pull force applied at the surface of the substrate 100. In this embodiment, the pull force, such as a suction force, is provided at the elastic dominant zone 110 by the force applicator head 115. The pull force provides sufficient energy to transform the liquid-like characteristic of the viscoelastic material to solid-like characteristic. In addition to providing the force to transform the characteristic of the viscoelastic material, the pull force is configured to remove the viscoelastic material from the elastic dominant zone 110 on the surface of the substrate while the viscoelastic material continues to exhibit solid-like characteristic, thereby resulting in a substantially clean substrate surface.

Figure 1C:
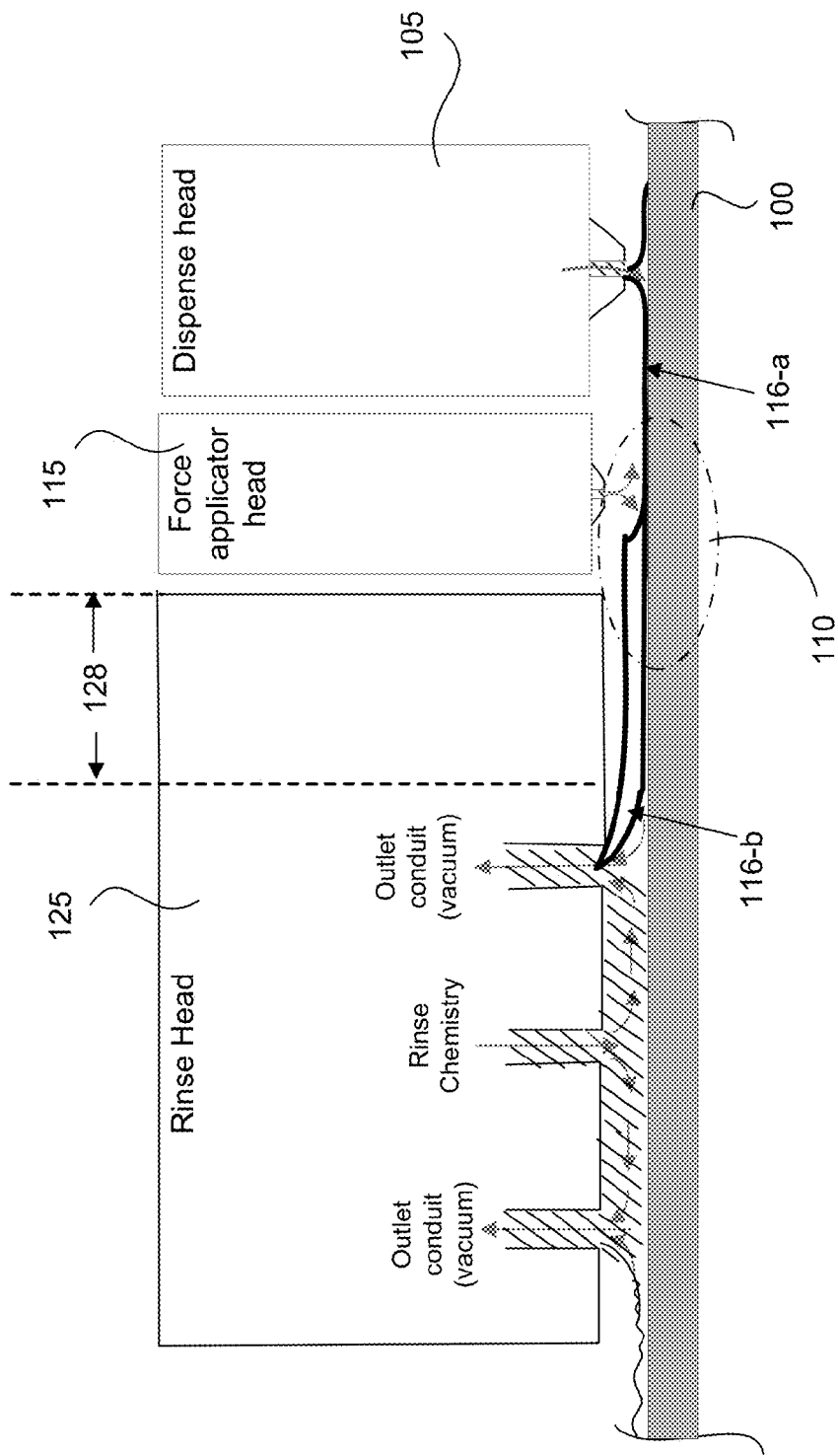
FIG. 1C illustrates a simplified block diagram of a particle removal mechanism with an extended spacer in a leading edge of a rinse head, in one embodiment of the invention.

In one embodiment of the invention, the particle removal mechanism may include extended spacer to extend an effect of the force on the viscoelastic material. FIG. 1C illustrates a particle removal mechanism with an extended spacer 128 integrated on a leading edge of the rinse head 125. The carrier (not shown) receives, supports and transports the substrate along an axis under each of the dispense head 105, the force applicator head 115 and the rinse head 125, respectively. As the substrate 100 moves under the dispense and force applicator heads, the substrate surface gets exposed to the viscoelastic material dispensed by the dispense head 105 and the external force applied by the force applicator head 115. As the substrate 100 continues to move along the axis under the rinse head 125, the extended spacer 128 integrated at the leading edge of the rinse head 125 acts as a tunnel and creates a "tunnel effect" within the rinse head extending the force effect on the viscoelastic material. By adding the extended spacer 128 in the leading edge of the rinse head within the particle removal mechanism, the amount of force applied to the viscoelastic material could be reduced while continuing to provide the same effect as a force without any extended spacer. In the case where there is no extended spacer provided, a greater amount of force has to be applied to the viscoelastic material in order to effectively remove comparable amount of particle contaminants. In one embodiment, the extended spacer is located such that the spacer 128 creates an extended force effect on the viscoelastic material prior to entering the rinse meniscus.

Figure 2A:
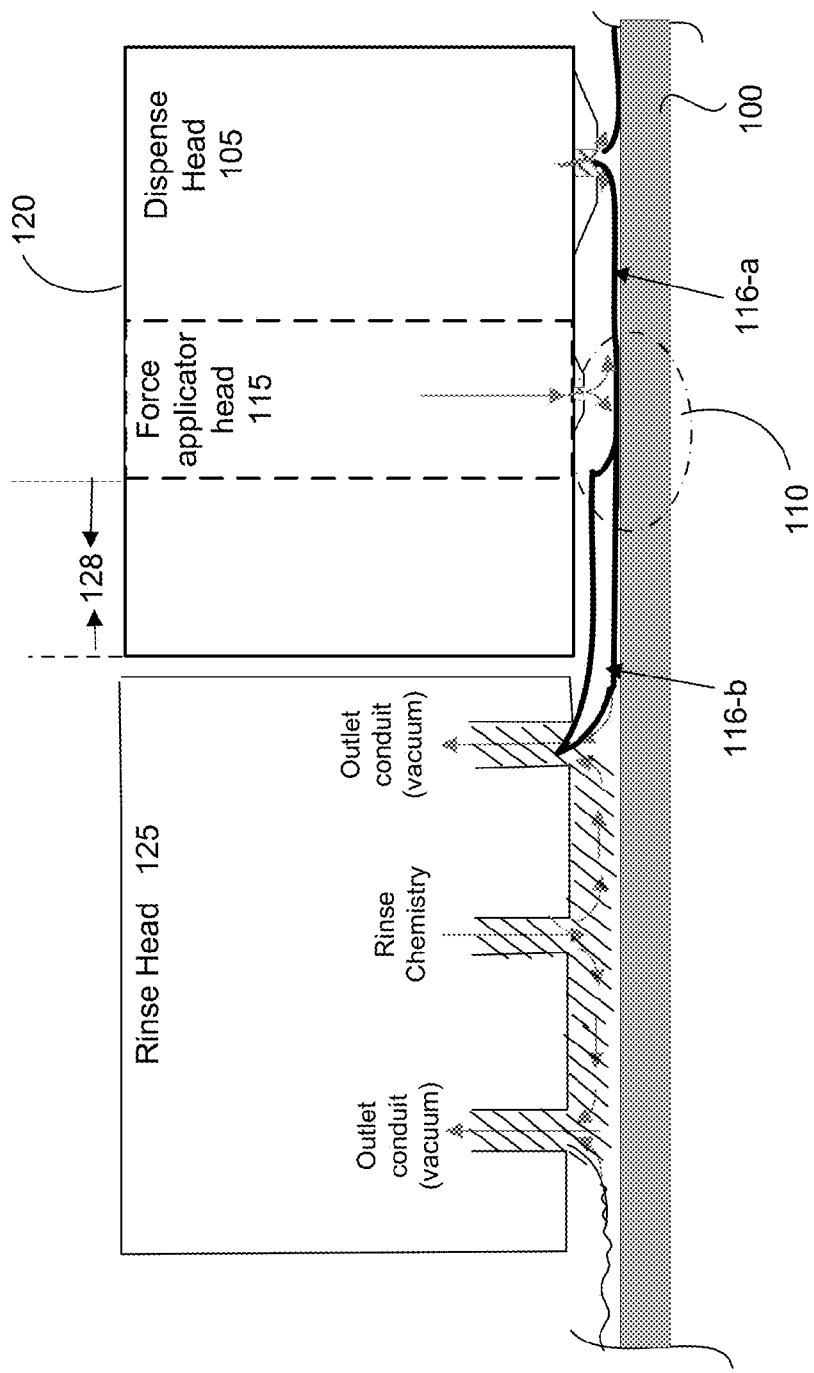
FIG. 2A illustrates a simplified block diagram of a force applicator head integrated with a dispense head followed by a rinse head, in accordance with one embodiment of the invention.

The force applicator head 115 may remain distinct or may be integrated with any one of a dispense head 105 or a rinse head 125. FIG. 2A illustrates an embodiment wherein the force applicator head 115 is integrated with the dispense head 105. In this embodiment, the force applicator head 115 is integrated on a trailing edge of the dispense head 105 resulting in an integrated head 120. The dispense head 105 coats a viscoelastic material as a thin film of liquid to the surface of the substrate and the force applicator head 115 applies an external force to a first area of the surface of the substrate coated with the liquid film defining an elastic dominant zone 110. The force is applied for a time duration that is shorter than a intrinsic time of the viscoelastic material. If the force is applied slowly at the elastic dominant zone 110, the viscoelastic material will remain substantially liquid retaining liquid-like characteristic. However, if the force is applied rapidly for a shorter duration than the intrinsic time of the viscoelastic material, the viscoelastic material will start exhibiting solid-like characteristic. In the various embodiments described herein, the viscoelastic material is selected so as to have a longer intrinsic time. In one embodiment, the viscoelastic material may have a intrinsic time of 1 second. In this embodiment, if the external force is applied for a time duration of less than one second, the viscoelastic material will begin to exhibit solid-like characteristic.

In one embodiment, an extended spacer may be provided at a trailing edge of an integrated head 120 which consists of dispense head and force applicator head, as illustrated in FIG. 2A. In this embodiment, the force applicator head 115 is integrated on a trailing edge of the dispense head 105 and an extended spacer 128 is provided at the trailing edge of the integrated head 120. As explained earlier, the extended spacer 128 extends the effect of the force provided by the force applicator head. By using extended spacer 128, smaller force may be used to overcome the adhesive force between the solid surface and the particle contaminants resulting in efficient removal of the particle contaminants from the surface.

Figure 2B:
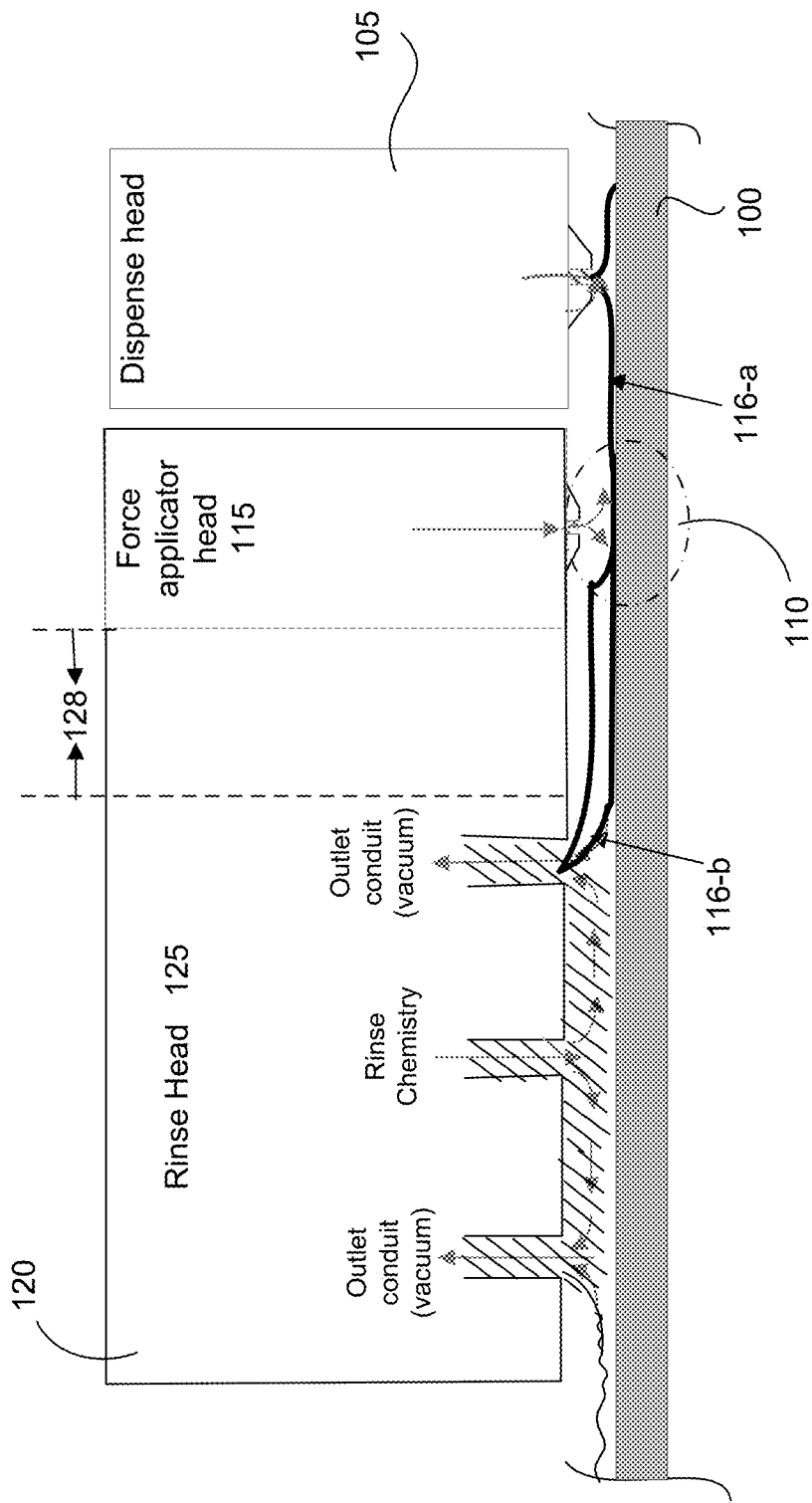
FIG. 2B illustrates a simplified block diagram of a dispense head followed by a force applicator head integrated with a rinse head, in accordance with an alternate embodiment of the invention.

In yet another embodiment of the invention, the force applicator head 115 may be integrated with a rinse head 125 as illustrated in FIG. 2B. In this embodiment, the force applicator head 115 is integrated on a leading edge of the rinse head 125 resulting in an integrated head 120. A dispense head 105 is configured to coat a viscoelastic material as a thin film of liquid meniscus to a surface of the substrate 100. The substrate is moved under the dispense head 105 so as to be coated with viscoelastic material as a thin film of liquid meniscus 116-a. The surface is then moved under the force applicator head 115 within the integrated head 120. The force applicator head 115 applies an external force to a first area of the liquid meniscus 116-a defining an elastic dominant zone 110 for a time duration that is shorter than a intrinsic time of the viscoelastic material. The force provides sufficient energy to allow the viscoelastic material to exhibit solid-like characteristic 116-b in the region of the first area during the application of the force enabling easy peel off by tugging on the material resulting in a substantially clean substrate surface. The viscoelastic material coated on the surface of the substrate continues to exhibit liquid-like characteristic in the second area during the removal from the region of the first area.

In one embodiment, the force applicator head is integrated on the leading edge of rinse head outside a boundary of the viscoelastic material meniscus. In another embodiment, the force applicator head is integrated on the leading edge of rinse head inside a boundary of the viscoelastic material meniscus. The above embodiments are considered exemplary and are in no way limiting.

In yet another embodiment of the invention, the integrated head 120 of FIG. 2B may additionally include an extended spacer 128 between the force applicator head 115 and rinse head 125, as illustrated in FIG. 2B. The extended spacer 128 extends the effect of the force applied to the viscoelastic material on the surface resulting in the usage of a substantially smaller force to overcome the adhesive force between the particle contaminants and surface.

As mentioned earlier, the external force could be a push force or a pull force. The push force could be a force that impinges normally or at an angle to the wafer surface supplied by either an inert gas or a liquid chemistry. The inert gas could be Nitrogen, air or any other inert gas and the liquid chemistry could be de-ionized water (DIW) or any other liquid chemistry. The pull force could be a force directed away from the wafer either normal or at an angle to the wafer surface provided by vacuum, inert gas or a liquid chemistry. Similarly, the dispense head 105, force applicator head 115 and rinse head 125 may be distinct linear proximity heads. It should be understood that the embodiments are not restricted to linear proximity heads but may be extended to include spin heads or may use other batch cleaning mechanisms, as well.

For more information on proximity heads, orientation and configuration of proximity heads, configuration and functions of arm assembly, and transducers within proximity heads for cleaning using acoustic energy, reference can be made to U.S. application Ser. No. 10/611,140 filed on Jun. 30, 2003, entitled "METHOD AND APPARATUS FOR CLEANING A SUBSTRATE USING MEGASONIC POWER" and assigned to the assignee of the current application, which is incorporated herein by reference.

Exemplary proximity heads and their respective configurations and patterns of the inlet conduits as well as the outlet conduits may be seen in U.S. patent applications Ser. Nos. 10/261,839, 10/404,270, and 10/330,897 which have been incorporated herein by reference. Therefore, any, some, or all of the proximity heads described herein may be utilized in any suitable configuration for suitable substrate cleaning and drying. In addition, the proximity head may also have any suitable numbers or shapes of outlet conduits and inlet conduits.

For more information on the viscoelastic material used for cleaning the substrate, reference can be made to U.S. Provisional Application No. 61/013,950 filed on Dec. 14, 2007, entitled "MATERIALS AND METHODS FOR PARTICLE REMOVAL BY SINGLE-PHASE AND TWO-PHASE MEDIA," assigned to the assignee of the instant application, which is incorporated herein by reference.

Figure 3A:
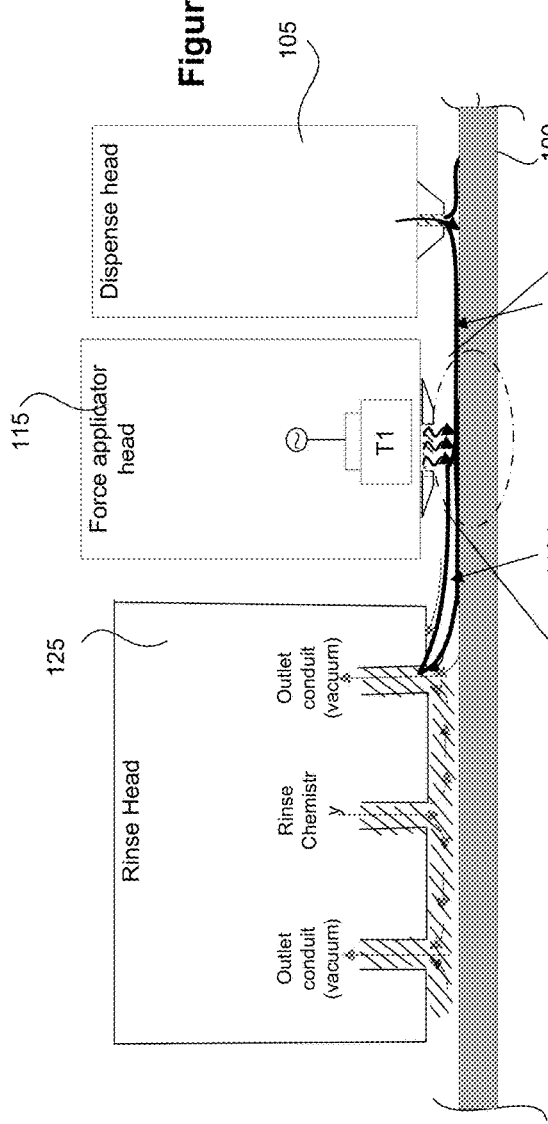
FIG. 3A illustrates a simplified block diagram of a substrate surface cleaning mechanism for providing acoustic energy to access solid-like characteristic of a viscoelastic material, in one embodiment of the invention.
Figure 3B:
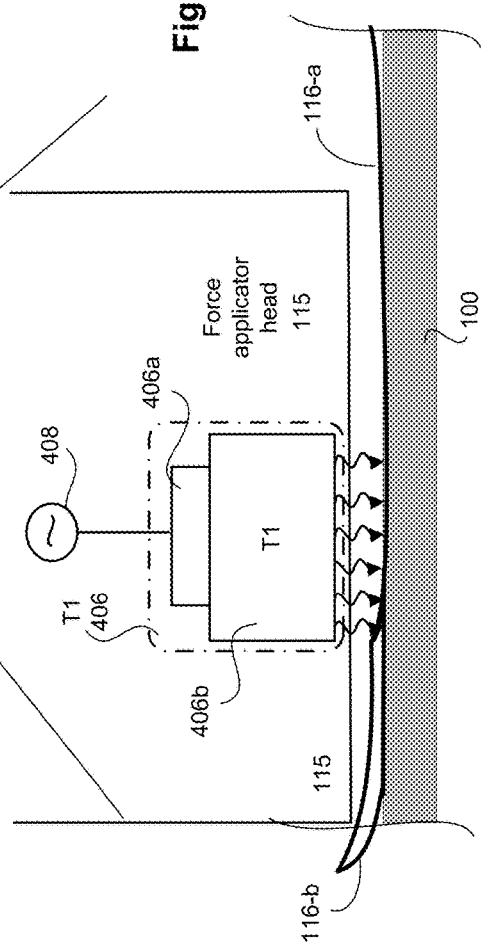
FIG. 3B illustrates an explosive view of a portion of a substrate surface cleaning mechanism illustrated in FIG. 3A.

In another embodiment, the force could induce oscillatory motion in the liquid meniscus of the viscoelastic material. FIG. 3A illustrates a simple block diagram of a particle removal mechanism to induce oscillatory motion using acoustic energy and FIG. 3B illustrates an explosive view of the workings of a transducer 406. In this embodiment, the force applicator head 115 is equipped with a transducer 406 to generate acoustic energy that induces oscillatory motion within the viscoelastic material applied at the surface of the substrate. The transducer 406 includes a transducer body 406b and a piezo electric element 406a that is connected to a power supply 408. The power supply 408 could be any type of power-supply, such as radio-frequency power supply. The transducer 406 is located close to a bottom surface of the force applicator head 115 facing a top surface of the surface of the substrate such that acoustic energy generated at the transducer 406 is transferred without substantial loss in strength. The transducer body 406b receives the power from the power-supply 408 through the piezo electric element 406a and converts the power into acoustic energy. The acoustic energy is then transmitted to a first area of the viscoelastic material supplied by the dispense head 105 as a liquid meniscus. In one embodiment, a liquid medium may be applied through the force applicator head 115 and the acoustic energy from the transducer 406 within the force applicator head 115 is transmitted to the first area of the viscoelastic material through the liquid medium which acts as a couplant.

The transducer 406 may be of any suitable size, shape, and number as long as the transducer 406 is able to fit within the geometry of the force applicator head 115 and may apply acoustic energy to the substrate and introduce pulsing in the meniscus 116a. It should be appreciated that the transducer 406 may be located in any suitable region of the force applicator head that stands distinct or is integrated with the dispense head or rinse head so long as the transducer 406 is capable of applying pulsing to the meniscus 116a.

The acoustic energy provides a force that is strong enough to induce oscillatory motion through pulsing within the viscoelastic material. The force is applied to a first area of the substrate surface coated with the viscoelastic material such that a second area of the substrate surface coated with the viscoelastic material is not substantially subjected to the applied force. The force is applied for a time duration that is shorter than the intrinsic time of the viscoelastic material enabling access to the solid-like characteristic of the viscoelastic material. While exhibiting solid-like characteristic, the viscoelastic material interacts or binds at least partially with at least some of the particle contaminants. As the viscoelastic material continues to experience the force and exhibits solid-like characteristic in a region of the first area, the viscoelastic material and the particle contaminants are removed from the surface resulting in a substantially clean substrate surface. The viscoelastic material continues to exhibit liquid-like characteristic in the second area during the removal of the viscoelastic material from the region of the first area.

In another embodiment, the oscillatory motion is provided by mechanical force. In this embodiment, a mechanism to provide mechanical force is included in the force applicator head. The mechanism can be a motor connected to a power supply that provides a mechanical force to induce mechanical agitation within the viscoelastic material applied on the surface of the substrate. The mechanical agitation enables the viscoelastic material to exhibit solid-like characteristic. The solid-like characteristic interacts or binds at least partially with at least some of the particle contaminants and enables easy removal of the viscoelastic material along with the entrapped particle contaminants from the surface resulting in a substantially clean substrate surface. The aforementioned embodiments were described in terms of the viscoelastic material being a single phase chemical. Thus, although the viscoelastic material exhibits both solid-like and liquid-like characteristics, the viscoelastic material in the aforementioned embodiments, when applied to the surface of the substrate, was as a single phase chemical. The embodiments are not restricted to a single-phase chemical.

The viscoelastic material may be a two-phase (a solid-liquid, a solid-gas, or a liquid-gas) chemical or a three-phase (solid-liquid-gas) chemical. For more details about the two-phase chemical and three-phase chemical, reference can be made to U.S. patent application Ser. No. 12/131,654, filed on Jun. 2, 2008, entitled "Materials and Methods for Particle Removal by Single Phase and Two-Phase Media, U.S. application Ser. No. 12/131,660, filed on Jun. 2, 2008, entitled "Materials and Methods for Particle Removal by Single Phase and Two-Phase Media, and to U.S. patent application Ser. No. 11/532,491, filed on Sep. 15, 2006, entitled "Method and Material for Cleaning a Substrate", U.S. application Ser. No. 12/165,577, filed on Jun. 30, 2008, entitled "Single Substrate Processing Head for Particle Removal using Low Viscosity Fluid", which are incorporated herein by reference.

In one embodiment, the viscoelastic material may have a chemical structure that may include multiple intrinsic times. In this embodiment, the pull force, the push force or the oscillatory force may be fine tuned to optimally access the solid-like characteristic of the viscoelastic material. The viscoelastic material may include any one of suspension, worm-like micelles, surfactants, magneto/electro-rheological solutions and viscoelastic solids, such as rubber, gels, and adhesives and any combination of the former.

In yet another embodiment, a particle removal mechanism may include a nozzle or spray to introduce a push or a pull force to a viscoelastic material applied on the surface of the substrate. FIG. 4A illustrates a side view of a simplified particle removal mechanism and FIG. 4B illustrates a top view of the particle removal mechanism illustrated in FIG. 4A. In this embodiment, a receptacle 410 is used to receive and hold a viscoelastic material as a liquid medium. The particle removal mechanism also includes a carrier mechanism 420 to receive, support and move a substrate 100 along an axis within the receptacle 410 so that a thin layer of viscoelastic material is coated on the surface of the substrate 100. The carrier mechanism 420 may, in turn, be connected to a mechanism, such as a motor mechanism, to enable the carrier and the received substrate to move along an axis. A force applicator mechanism 430 is used to provide an external force to the viscoelastic material covering the surface of the substrate for a time period shorter than an intrinsic time of the viscoelastic material. The force applicator mechanism 430 may be a nozzle or a high-speed rinse gun that provides a push force of inert gas or liquid chemical (DIW) to the viscoelastic material. The force applicator mechanism 430 may also provide a pull force using vacuum. The force applicator mechanism 430 is connected to a reservoir that provides the vacuum flow, the inert gas flow or liquid chemical flow. The force applicator mechanism is not restricted to the nozzle or a high-speed rinse gun but can extend to other types of mechanism that are capable of providing external force to the viscoelastic material. In one embodiment, the force application includes two phase rinse using a push force. In this embodiment, the force applicator mechanism 430 provides the inert gas or liquid chemical in a jet spray followed by a spray of air to dry the chemical out. Although specific examples have been embodied, it should be noted that variations of these embodiments are also possible.

In one embodiment, the force applicator mechanism is mounted on a moveable arm, as shown in FIGS. 4A and 4B. The moveable arm is used to move the force applicator mechanism 430 to appropriate positions over the surface of the substrate so that a force may be applied to a first area of at least a portion of the solid surface coated with the viscoelastic material. The force is applied such that a second area of the surface of the substrate coated with viscoelastic material is not substantially subjected to the applied force. In one embodiment, the carrier mechanism supporting the solid surface may be rotated along an axis of rotation relative to the external force applied by the force applicator mechanism so that the external force is applied substantially evenly to the first area of the surface of the substrate coated with viscoelastic material. Upon the application of the force, the viscoelastic material in the first area starts exhibiting solid-like characteristic. The viscoelastic material, at this time, interacts or binds at least partially to at least some of the particle contaminants found on the surface of the substrate. While the force is being applied and the viscoelastic material in the first area continues to exhibit solid-like characteristic, the viscoelastic material is removed along with some of the particle contaminants that have interacted with the material. The viscoelastic material applied to the surface of the substrate in the second area continues to exhibit liquid-like characteristic during the removal of the viscoelastic material from a region of the first area. In this embodiment, the force applicator mechanism 430 is configured to not only apply the external force but also to help in removing the viscoelastic material from the first area of the surface while the viscoelastic material is exhibiting the solid-like characteristic. Removal of the viscoelastic material from a region of the first area is enabled by either a pulling force or pushing force using inert gas, a liquid chemical or vacuum.

Although the embodiments illustrated in FIGS. 4A and 4B disclose the force applicator mechanism disposed on a moveable arm, variations of this embodiment can also be considered. For instance, in one embodiment, the force applicator mechanism may be mounted on a stationary arm and the force applied to a first area of the surface of the substrate while the second area of the surface of the substrate with viscoelastic material is not substantially subjected to the applied force. In this embodiment, a mechanism (such as "chuck" mechanism) on which the substrate is received and supported, rotates the substrate along an axis of rotation so that the surface of the substrate is uniformly exposed to the applied force. The viscoelastic material exposed to the applied force starts exhibiting solid-like characteristics and is removed from the surface along with particle contaminants that have interacted with the viscoelastic material.

It should be noted that the embodiments are not restricted to the application of the viscoelastic material to a portion of the surface of the substrate but can include other variations, such as embodiments wherein the viscoelastic material is applied to cover the entire surface of the substrate. In one embodiment, the viscoelastic material is dispensed so as to coat the entire surface of the substrate starting from a center and proceeding to the edge, then rinsed from center towards the edge by the application of either a push force or a pull force so that the viscoelastic material may exhibit solid-like characteristics. In another embodiment, a full-back megasonics or acoustical vibration is applied to the viscoelastic material covering the entire surface, instead of a pull or push force mentioned in the prior embodiment, while simultaneously rinsing the entire surface of the substrate starting from the center and proceeding towards the edge. In yet another embodiment, a mechanical oscillatory motion is applied to the viscoelastic material covering the entire surface of the substrate instead of the acoustical vibration mentioned in the prior embodiment, while simultaneously rinsing the entire substrate starting from the center.

Optimal removal of contaminant particles from a surface depends on various parameters including parameters associated with the force being applied, parameters associated with viscoelastic material, parameters associated with dispense head, force applicator head, rinse head and optionally extended spacer when integrated into the dispense head or rinse head. Some of the parameters that are considered during removal include amount of pull/push force, gap between corresponding heads and the solid surface, angle of pull or push force, size of extended spacer, dispense volume of viscoelastic material onto the surface, etc. In one embodiment where a pull force is applied (suction or vacuum force) using inert gas (Nitrogen or air) flow, the various parameters that have shown promising results in optimal removal of viscoelastic material along with particle contaminants include about 10 to about 1000 standard liters per minute (slm) suction air flow, with preferably about 200 to about 500 slm suction air flow; about 0.3 mm to about 3 mm solid surface-to-head gap, with preferably about 0.5-1 mm gap; about 0 degree (normal to the solid surface) to about 60 degrees suction flow angle, with preferably about 0 deg to about 30 degree angle; about 5 to about 100 mm extended spacer length (where available), with preferably about 10 mm to about 50 mm spacer length; and about 10 ml/minute to about 500 ml/minute dispense volume, with preferably about 100 ml/minute to about 200 ml/minute dispense volume. The above parameters may be applicable to the force applicator head (FAH) integrated on leading edge of rinse head outside of a boundary of the viscoelastic material meniscus, FAH integrated on leading edge of rinse head inside of a boundary of the viscoelastic material meniscus, FAH integrated on trailing edge of dispense head or when FAH remains distinct from the rinse head and the dispense head and is positioned between the dispense and rinse heads.

In another embodiment where a pull force (suction force) is applied using liquid (DIW) flow, the various parameters that have shown promising results in optimal removal of viscoelastic material along with particle contaminants include about 100 ml/min to about 5000 ml/min suction liquid flow, with preferably about 1000 ml/min to about 4000 ml/min suction liquid flow; about 0.1 mm to about 3 mm solid surface-to-head gap, with preferably about 0.3 mm to about 1 mm gap; and about 0 degree (normal to the substrate surface) to about 60 degrees suction flow angle, with preferably about 0 deg to about 30 degree angle; about 5 to about 100 mm extended spacer length, with preferably about 10 mm to about 50 mm spacer length; about 10 ml/minute to about 500 ml/minute dispense volume, with preferably about 100 ml/minute to about 200 ml/minute dispense volume. The above parameters may be applicable to the force applicator head (FAH) near the leading edge or the trailing edge of the rinse head within a boundary of the viscoelastic material meniscus.

In another embodiment where a push force is applied (such as blow force) using inert gas (Nitrogen or air) flow, the various parameters that have shown promising results in optimal removal of viscoelastic material along with particle contaminants include about 10 slm to about 100 slm gas flow, with preferably about 30 to about 80 slm gas flow; about 0.5 mm to about 15 mm substrate surface-to-head gap, with preferably about 1 to about 5 mm gap; about 0 degree (normal to the substrate surface) to about 60 degrees suction flow angle, with preferably about 30 deg to about 45 degree angle; about 5 to about 100 mm extended spacer length, with preferably about 10 mm to about 50 mm spacer length; and about 5 ml/minute (substrate surface) to about 100 ml/minute dispense volume, with more preferably about 10 ml/minute to about 30 ml/minute dispense volume. The above parameters may be applicable where the force applicator head (FAH) is integrated on leading edge of rinse head, FAH integrated on trailing edge of dispense head, or when FAH remains distinct from the rinse head and the dispense head and is positioned between the dispense and rinse heads. The FAH is located such that the inert gas flow impinges on the viscoelastic material meniscus applied on the solid surface.

In another embodiment where a pull force is applied (such as blow force) using a liquid chemical (DIW) flow, the various parameters that have shown promising results in optimal removal of viscoelastic material along with particle contaminants include about 100 ml/min to about 5000 ml/min liquid chemical flow, with preferably about 2000 to about 4000 ml/min liquid chemical flow; about 0.1 mm to about 3 mm substrate surface-to-head gap, with preferably about 0.3 to about 1 mm gap; and about 0 degree (normal to the substrate surface) to about 60 degrees suction flow angle, with preferably about 0 deg to about 30 degree angle. about 5 to about 100 mm extended spacer length, with preferably about 10 mm to about 50 mm spacer length. The above parameters may be applicable where the force applicator head (FAH) is near the leading edge or the trailing edge of rinse head but within a boundary of viscoelastic material meniscus.

In addition to the parameters associated with pull/push forces using inert gas or liquid chemical flow, the embodiments may be used to provide oscillatory motion using force applied through acoustic energy, mechanical energy or through other forms of energy. The oscillatory motion may be applied by pulsing dispense or pulsing suction flow of a viscoelastic material supplied to the surface of the substrate by applying oscillatory force adjacent to the dispense head. Alternately, mechanical oscillation may be provided by pulsing dispense or pulsing suction of Deionized water (DIW) rinse flow using oscillatory force adjacent to the dispense head. For the viscoelastic material having an intrinsic time of 0.5 seconds, pulsing frequency of about 2 Hz to about 1000 Hz, with preferably about 10 Hz to about 100 Hz has shown promising result in the optimal removal of particle contaminants by accessing solid-like characteristic of the viscoelastic material.

Similarly, for acoustic oscillation with ultrasonic or megasonic plate coupled to viscoelastic material and solid surface through DIW, the parameters associated with the acoustic energy that have shown promising results in optimal removal of the particle contaminants from the surface include, pulsing frequency using ultrasonic energy of about 10 kHz to about 500 kHz, and more preferably about 44 kHz, 88 kHz or 132 kHz, or pulsing frequency using megasonic energy of about 800 kHz to about 2 MHz, and more preferably about 1.4 MHz provided through about 10 to about 1000 Watt power source. In this embodiment, the DIW acts as a couplant to transmit the acoustic energy to the viscoelastic material.

The mechanism of contaminant particle removal is explained with respect to the access of different modes of operation of the viscoelastic material. The viscoelastic material exhibits substantial liquid-like characteristic up to the point where an external force is applied at which time the viscoelastic material exhibits substantial solid-like characteristic. The solid-like characteristic helps in grabbing the particle contaminants easily. This is because when a solid, such as particle contaminants, is underneath a liquid and a force is exerted from the top of the liquid, only a portion of the force from the liquid can transmit to the underlying solid before the liquid dissipates. On the other hand, when a first solid is on top of a second solid (particle contaminant) and a force is exerted to the second solid from the top of the first solid, the force applied to the first solid can be completely transmitted to the second solid underneath the first solid without fear of dissipation of the first solid. The viscous nature of the viscoelastic material exhibiting liquid-like characteristic enables easy application on the surface and subsequent removal from the surface and the solid-like characteristic enables grabbing the particle contaminants using the applied force. For sample viscoelastic material that has shown promising results please refer to U.S. patent application Ser. No. 12/131,654 filed on Jun. 2, 2008, and entitled "MATERIALS FOR PARTICLE REMOVAL BY SINGLE-PHASE AND TWO-PHASE MEDIA," and to U.S. patent application Ser. No. 12/165,577, filed on Jun. 30, 2008, entitled "SINGLE SUBSTRATE PROCESSING HEAD FOR PARTICLE REMOVAL USING LOW VISCOSITY FLUID," which are incorporated herein by reference.

Figure 5:
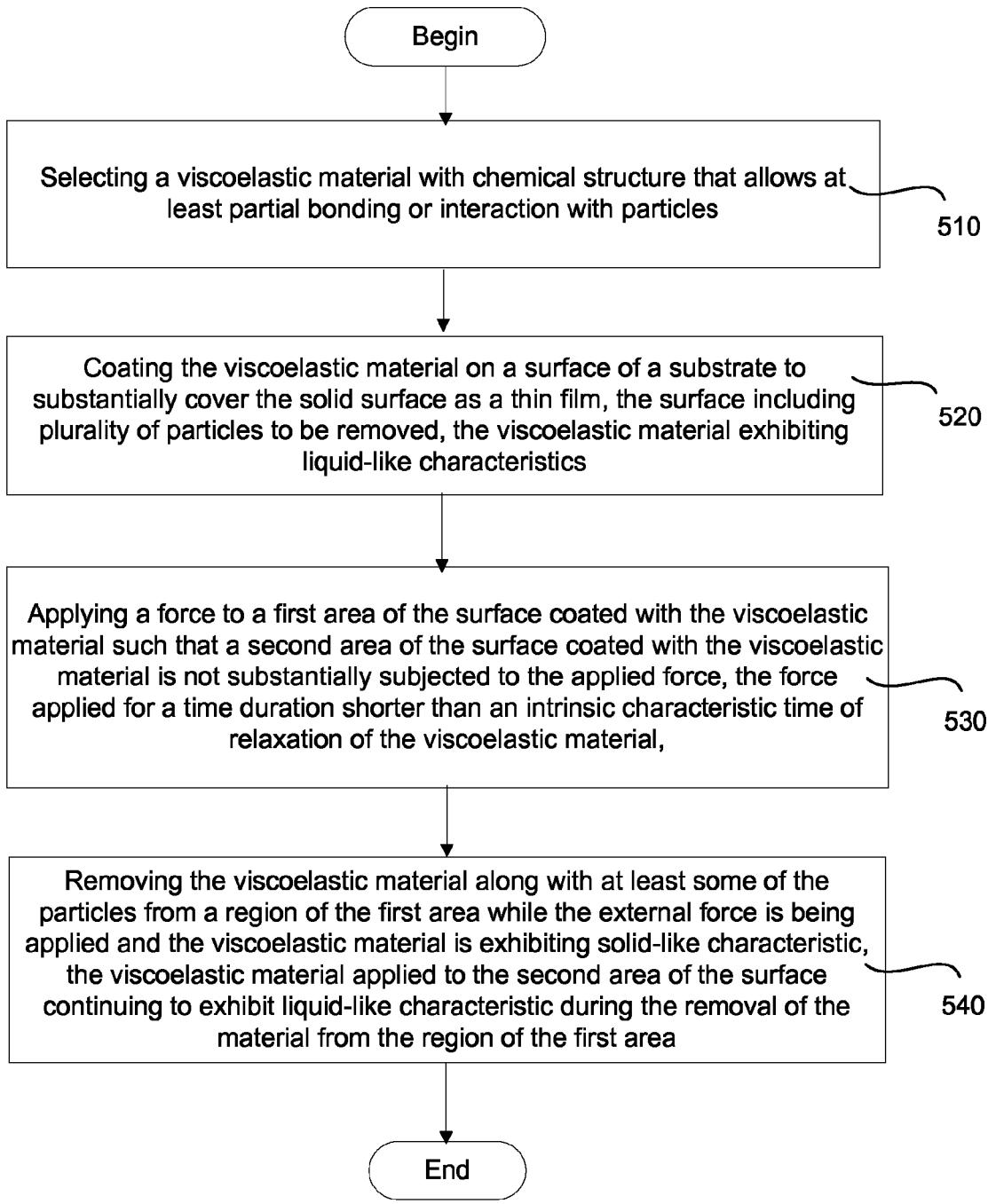
FIG. 5 illustrates a flow chart of operations for providing external force to access solid-like characteristics of a viscoelastic material, in one embodiment of the invention.

With the above detailed description of various embodiments, a method for removing particle contaminants from a substrate surface will now be described with reference to FIG. 5. FIG. 5 illustrates various process operations involved in successfully removing particle contaminants from a substrate surface using an external force that accesses solid-like characteristic of a cleaning chemical applied on the solid surface. The method begins with selecting an appropriate viscoelastic material, as illustrated in operation 510. The viscoelastic material is chosen so as to include chemical structure that enables at least partial binding or interaction with at least some of the particle contaminants on the surface of the substrate and is capable of exhibiting liquid-like and solid-like characteristic based on force applied to the viscoelastic material.

The chosen viscoelastic material is coated as a thin film on the surface, as illustrated in operation 520. The viscoelastic material substantially covers the surface as a thin film. The viscoelastic material, at this time, exhibits liquid-like characteristic. An external force is applied to a first area of the viscoelastic material applied on the substrate surface, as illustrated in operation 530. The external force is applied such that a second area of the substrate coated with viscoelastic material is not substantially subjected to the applied force. The external force is applied for a time duration that is shorter than an intrinsic time of the viscoelastic material. The intrinsic time, as used in this application, is defined as time required for the viscoelastic material to relax. When the force is applied for a shorter time than the intrinsic time, the viscoelastic material will start exhibiting solid-like characteristic.

While the force is being applied and the viscoelastic material is exhibiting solid-like characteristic, the viscoelastic material successfully interacts at least with some of the particle contaminants successfully binding the particle contaminants which are then removed from a region of the first area of the substrate surface along with the viscoelastic material, as illustrated in operation 540, by peeling off the material. It should be noted that the viscoelastic material applied continues to exhibit the liquid-like characteristic in the second area during the removal of the viscoelastic material from the first region of the first area. By removing the viscoelastic material while accessing the solid-like characteristic, a thorough cleaning is enabled resulting in a substantially clean substrate surface. As a result, contaminants left behind by the cleaning operation is greatly reduced making this a more effective and efficient cleaning method. The method concludes with the thorough removal of the viscoelastic material from the first area along with at least some of the particle contaminants by accessing the solid-like characteristic.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for removing particle contaminants from a surface of a substrate being treated, comprising:
    coating a layer of a viscoelastic material to the surface as a thin film, the viscoelastic material is defined as a solid-liquid material exhibiting liquid-like characteristic when applied to the surface of the substrate and having a chemical structure that allows at least partial interaction or binding with the particle contaminants present on the surface;
    applying a force to a first area covering a portion of the surface coated with the viscoelastic material such that a second area covering a second portion of the surface coated with the viscoelastic material is not subjected to the applied force, the force being applied to the first area for a time duration shorter than an intrinsic characteristic time of relaxation of the viscoelastic material so as to access solid-like characteristics of the viscoelastic material in a region of the first area during the time force is applied, wherein a treatment region defined by the first area and the second area is less than an entire surface of the substrate;
    removing the viscoelastic material from the first area while the force is applied to the viscoelastic material in the first area during the removal, the removing of the viscoelastic material includes removing at least some of the particle contaminants from the surface, wherein the removing occurs in a region of the first area of the surface while the viscoelastic material is exhibiting solid-like characteristic and while the viscoelastic material continues to exhibit the liquid-like characteristic in the second area during the removing in the region of the first area; and
    moving the substrate, after the removal of the viscoelastic material from the first area, such that the applying and the removing are performed on other areas on the surface of the substrate coated with the layer of the viscoelastic material that are different from the first area, wherein the other areas include the second area, wherein applying a force includes providing a pull force to pull the viscoelastic material away from the surface of the substrate.

2. The method of claim 1, wherein the pull force is provided as vacuum flow.

3. The method of claim 1, wherein removing the viscoelastic material further includes removing the viscoelastic material from the first area before the viscoelastic material starts exhibiting liquid-like characteristics.

4. The method of claim 1, wherein applying a force further includes,
    fine-tuning a frequency of the force to enable access to solid-like characteristic of the viscoelastic material, when the viscoelastic material exhibits multiple intrinsic time.

5. The method of claim 1, wherein the viscoelastic material includes any one of suspensions, worm-like micelles, surfactants, magneto/electro-rheological solutions and viscoelastic solids, such as rubbers, gels, and adhesives, and any combination thereof.

6. A method for removing particle contaminants from a surface of a substrate being treated, comprising:
    coating a cleaning chemical having viscoelastic properties as a thin film meniscus on the surface of the substrate, the cleaning chemical is defined as a solid-liquid material exhibiting substantial liquid-like characteristics when applied to the surface of the substrate, the cleaning chemical interacting with at least some of the particle contaminants on the surface and partially binding the particle contaminants;
    applying an external force to a first area covering a portion of the surface coated with the cleaning chemical such that a second area covering a second portion of the surface coated with the cleaning chemical is not subjected to the external force, the application of the external force creating an elastic dominant zone in the first area where the external force is applied such that the cleaning chemical exhibits solid-like characteristics in the elastic dominant zone during the time the external force is applied, wherein a treatment region defined by the first area and the second area is less than an entire surface of the substrate;
    removing the cleaning chemical from the first area while the external force is being applied to the cleaning chemical in the first area during the removal while the cleaning chemical is exhibiting solid-like characteristic, and while the cleaning chemical continues to exhibit liquid-like characteristic in the second area during the removal of the cleaning chemical from the first area; and
    moving the substrate, after the removal of the cleaning chemical from the first area, such that the applying and removing are performed on areas on the surface of the substrate that are different from the first area, wherein the other areas include the second area and wherein the external force applied is a pull force to pull the cleaning chemical away from the surface of the substrate.

7. The method of claim 6, wherein applying the external force to the first area is for a time duration that is shorter than an intrinsic characteristic time of relaxation of the cleaning chemical.

8. The method of claim 6, wherein the cleaning chemical is selected so as to have a longer intrinsic characteristic time of relaxation.

9. The method of claim 6, wherein the cleaning chemical includes multiple intrinsic times.

10. The method of claim 9, wherein the external force is fine-tuned to access the solid-like characteristic of the cleaning chemical.

* * * * *